(12) United States Patent
Koole et al.

(10) Patent No.: US 10,035,952 B2
(45) Date of Patent: Jul. 31, 2018

(54) PDMS-BASED LIGANDS FOR QUANTUM DOTS IN SILICONES

(71) Applicant: KONINKLIJKE PHILIPS N.V., Eindhoven (NL)

(72) Inventors: Roelof Koole, Eindhoven (NL); Rifat Ata Mustafa Hikmet, Eindhoven (NL); Patrick John Baesjou, Eindhoven (NL); Marcel Rene Bohmer, Eindhoven (NL); Johan Lub, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 173 days.

(21) Appl. No.: 14/438,286

(22) PCT Filed: Oct. 23, 2013

(86) PCT No.: PCT/IB2013/059577
§ 371 (c)(1),
(2) Date: Apr. 24, 2015

(87) PCT Pub. No.: WO2014/064620
PCT Pub. Date: May 1, 2014

(65) Prior Publication Data
US 2015/0291876 A1    Oct. 15, 2015

Related U.S. Application Data

(60) Provisional application No. 61/718,260, filed on Oct. 25, 2012.

(51) Int. Cl.
*F21V 9/16* (2006.01)
*C09K 11/02* (2006.01)
(Continued)

(52) U.S. Cl.
CPC ............. *C09K 11/025* (2013.01); *C08J 5/005* (2013.01); *C09K 11/883* (2013.01);
(Continued)

(58) Field of Classification Search
CPC .......... C08L 83/04; C08L 83/00; C08L 63/00; C08L 83/08; B01D 19/0409; B82Y 20/00;
(Continued)

(56) References Cited

U.S. PATENT DOCUMENTS 4,556,725 A   12/1985 Kanner et al.
7,250,082 B2   7/2007 Jang et al.
(Continued)

FOREIGN PATENT DOCUMENTS

CN    101810054 A    8/2010
CN    102217106 A    10/2011
(Continued)

OTHER PUBLICATIONS

Peng Tao et al. "Transparent luminescent silicone nanocomposites filled with bimodal PDMS-brush-grafted CdSe quantum dots", Aug. 25, 2012; Journal of Materials Chemistry C, vol. 1, p. 86-94.*
(Continued)

*Primary Examiner* — Thien M Le

(57) ABSTRACT

The invention provides a process for the production of a light converter comprising a siloxane polymer matrix with light converter nano particles embedded therein, the process comprising (a) mixing (i) light converter nano particles having an outer surface grafted with grafting ligands and (ii) curable siloxane polymers, and (b) curing the curable siloxane polymers, thereby producing the light converter; wherein the grafting ligands comprise siloxane grafting ligands having x1 Si backbone elements, wherein at least one Si backbone element of each siloxane grafting ligand comprises a side group having a grafting functionality;
(Continued)

wherein the curable siloxane polymers have y1 Si backbone elements; and wherein x1 is at least 20, wherein y1 is at least 2, and wherein x1/y1≥0.8.

18 Claims, 5 Drawing Sheets

(51) Int. Cl.
    *C08J 5/00*        (2006.01)
    *G02F 1/1335*    (2006.01)
    *C09K 11/88*     (2006.01)
    *B82Y 20/00*     (2011.01)
    *B82Y 40/00*     (2011.01)

(52) U.S. Cl.
    CPC ........ *G02F 1/133603* (2013.01); *B82Y 20/00* (2013.01); *B82Y 40/00* (2013.01); *C08J 2383/06* (2013.01); *G02F 2001/133614* (2013.01); *Y02E 10/52* (2013.01); *Y10S 977/774* (2013.01); *Y10S 977/779* (2013.01); *Y10S 977/897* (2013.01); *Y10S 977/95* (2013.01)

(58) Field of Classification Search
    CPC ... G02F 2001/133614; G02F 1/133603; G02F 1/133609; G02F 1/133617; G02F 2001/133616; A61K 49/0093
    USPC .......................................................... 362/84
    See application file for complete search history.

(56) References Cited

U.S. PATENT DOCUMENTS

| | | | |
|---|---|---|---|
| 7,598,314 B2 | 10/2009 | Lee et al. | |
| 8,334,527 B2 | 12/2012 | Iizumi et al. | |
| 8,353,613 B2 | 1/2013 | Choi et al. | |
| 8,530,401 B2* | 9/2013 | Becker | B01D 19/0404 510/122 |
| 8,633,040 B2 | 1/2014 | Novichkov et al. | |
| 2006/0170331 A1 | 8/2006 | Bertram et al. | |
| 2007/0185261 A1 | 8/2007 | Lee et al. | |
| 2009/0121180 A1 | 5/2009 | Tsubokawa et al. | |
| 2010/0276638 A1 | 11/2010 | Liu et al. | |
| 2011/0240931 A1 | 10/2011 | Jang et al. | |
| 2011/0240960 A1 | 10/2011 | Kim et al. | |
| 2012/0025239 A1 | 2/2012 | Kim et al. | |
| 2012/0068118 A1 | 3/2012 | Parce et al. | |
| 2012/0157824 A1* | 6/2012 | Bossmann | G01N 33/54346 600/420 |
| 2012/0162573 A1 | 6/2012 | Takahashi et al. | |
| 2012/0320607 A1 | 12/2012 | Kinomoto et al. | |
| 2013/0026506 A1* | 1/2013 | Arbell | C09K 11/02 257/88 |
| 2014/0343233 A1 | 11/2014 | Benicewicz et al. | |

FOREIGN PATENT DOCUMENTS

| | | |
|---|---|---|
| CN | 102656233 A | 9/2012 |
| JP | 2005048171 A | 2/2005 |
| JP | 2006520077 A | 8/2006 |
| JP | 2009120437 A | 6/2009 |
| JP | 2011144272 A | 7/2011 |
| JP | 2012031375 A | 2/2012 |
| JP | 2012525467 A | 10/2012 |
| KR | 20120067541 A | 6/2012 |
| RU | 2381304 C1 | 2/2010 |
| WO | 2008063653 | 5/2008 |
| WO | 2009035657 | 3/2009 |
| WO | 2010014198 | 2/2010 |
| WO | 2010126606 | 11/2010 |
| WO | 2010026992 A1 | 3/2011 |
| WO | 2011031871 A1 | 3/2011 |
| WO | 2013078309 A1 | 5/2013 |
| WO | 2013114254 A2 | 8/2013 |

OTHER PUBLICATIONS

"Preparation of Highly Luminescent Nanocrystals and Thier Application to Light Emitting Diodes" Lim et al Advanced Materials 2007, 19 p. 1927-1932.
"Transparent Luminescent Silicone Nanocomposites Filled With Bimodal PDMS-Brush Grated CDSE Quantum Dots" Tao et al , Journal of Materials Chemistry, 2013 1 86.
"Tunable Photo Luminescent Properties of Novel Transparent CDSE QD Silicone Nanocomposiites" Yang et al Composites Science and Technology 71 (2011) p. 1652-1658.
"Encapsulation of Nanoparticles for the Manufacture of Solid State Lighting Devices" Thoma et al, Proc. of SPIE vol. 5276 (2004) 202-212.
"Thermal Behavior of a Quantum Dot Nancomposite as a Color Converting Material and Its Application to White LED" Woo et al, Nanotech 21,(2010).
First Office Action dated Apr. 12, 2016, China Patent Application No. 201380055745.1, 16 pages.
Second Office Action dated Dec. 30, 2016, China Patent Application No. 201380055745.1, 22 pages.
Office Action dated Jan. 3, 2017, Taiwan Patent Application No. 102138792, 7 pages.
Ying Li, et al, "Bimodal Surface Ligand Engineering: The Key to Tunable Nanocomposites", Langmuir, published Oct. 23, 2012, vol. 29, pp. 1211-1220.
JP Office Action dated Jun. 13, 2017, Japan Patent Application No. 2015-538609, 8 pages.
CN Third Office Action dated Jul. 13, 2017, China Patent Application 201380055745.1, 34 pages.
Tsougeni, et al, "Photosensitive poly (dimethylsiloxane) materials for microfluidic applications", ScienceDirect, Microelectronic Engineering 84 (2007) pp. 1104-1108.
Dung, et al., "InP Quantum Dot-Organosilicon Nanocomposites", Bull. Korean Chem. Soc. 2012, vol. 33, No. 5, (2012) pp. 1491-1504.
EPO as ISA, PCT/IB2013/058785 filed Sep. 24, 2013, "International Search Report and Written Opinion" dated Apr. 14, 2014, 11 pages.
First Office Action dated Mar. 30, 2016, China Patent Application No. 201380055922.6, 16 pages.
TW Office Action dated Nov. 16, 2016, Taiwan Patent Application No. 102138793, 9 pages.
Second Office Action dated Nov. 30, 2016, China Patent Application No. 201380055922.6, 16 pages.
Japan Office Action dated Aug. 15, 2017, Japan Patent Application No. 2015-538589, 7 pages.
Third Office Action dated Jun. 5, 2017, China Patent Application No. 201380055922.6, 8 pages.
Taiwan Office Action dated May 16, 2017, Taiwan Patent Application No. 102138792, 8 pages.
Official Action dated Sep. 13, 2017, Russia Patent Application No. 2015119545, 8 pages.
Decision on Rejection dated Feb. 13, 2018, China Patent Application No. 201380055745.1, 18 pages.
Decision to Refuse dated Nov. 28, 2017, Japan Patent Application No. 2015-538609, 6 pgs.
Article 94(3) EPC dated Dec. 7, 2017, European Application No. 13821964.7, 6 pgs.
Decision to Refuse dated Dec. 12, 2017, Japan Patent Application No. 2015-538589, 6 pgs.
Article 94(3) EPC dated Dec. 7, 2017, European Application No. 13801774.4, 5 pgs.

\* cited by examiner

PDMS-BASED LIGANDS FOR QUANTUM DOTS IN SILICONES

CROSS-REFERENCE TO PRIOR APPLICATIONS

This application is the U.S. National Phase application under 35 U.S.C. § 371 of International Application No. PCT/IB2013/059577, filed on Oct. 23, 2013, which claims the benefit of U.S. Patent Application No. 61/718,260, filed on Oct. 25, 2012. These applications are hereby incorporated by reference herein.

FIELD OF THE INVENTION

The invention relates to a process for the production of a polymer within the polymer embedded light converter nano particles, to a light converter thus obtained, and to a lighting unit comprising such (polymeric) light converter.

BACKGROUND OF THE INVENTION

The use of nano particles, such as quantum dots (QD), for lighting applications is known in the art. US20110240960, for instance, describes a light emitting device comprising a light emitting source, a first quantum dot wavelength converter disposed above the light emitting source, the first quantum dot wavelength converter comprising, a plurality of first quantum dots for generating wavelength-converted light by converting wavelength of light from the light emitting source, a first dispersive medium embedding the first quantum dots dispersively therein, and a first sealer for sealing the entire outside surface of dispersive medium embedding the first quantum dots in a pack.

A first encapsulant is applied for encapsulating the entire outside surface of the first quantum dot wavelength converter. Further, a second quantum dot wavelength converter is disposed above the first quantum dot wavelength converter, the second quantum dot wavelength converter comprising a plurality of second quantum dots for generating wavelength-converted light by converting wavelength of light from the light emitting source, a second dispersive medium embedding the second quantum dots dispersively therein, and a second sealer for sealing the entire outside surface of the second dispersive medium embedding the second quantum dots in a pack, wherein the first quantum dot wavelength converter, the second quantum dot wavelength converter and the light emitting source are spaced apart from each other. The second encapsulant is deposited on the entire outside surface of the second quantum dot wavelength converter and for encapsulating the entire outside surface of the second quantum dot wavelength converter. Further, the light emitting source is a light emitting diode or a laser diode.

SUMMARY OF THE INVENTION

Nano particles, such as quantum dots (QDs), have shown to be highly interesting in lighting applications. They could e.g. serve as inorganic phosphor in converting blue light to other colors and have the advantage of a relative narrow emission band and the advantage of color tunable by the size of the QDs to be able to obtain high quality pure white light.

In order to use QDs for LED applications, they need to be incorporated in a suitable matrix. A QD powder (without matrix) is not desired because of both concentration quenching effects and poor process ability of such a pure QD powder. Up to now, embedding of nano particles in many types of polymers appears to lead to aggregation of the nano particles. Currently, acrylic matrices are mostly used as a matrix for QDs, but they are known for their poor stability towards high blue light fluxes. We consider silicones the most preferred matrix for QDs because of the proven stability of silicones towards high blue fluxes (i.e. their proven compatibility with LEDs).

Silicones are currently used as standard matrix/resin for many LED-manufacturing processes. However, QDs generally have a hydrophobic organic coating (in the form of ligands, generally extending from the outer surface of the QD) which make them incompatible with silicones: generally a turbid mixture is obtained when QDs are mixed with silicones caused by agglomeration of the QDs. This is undesired because of concentration quenching effects, expected increased degradation effects, and an uncontrolled way of processing these films leading to spatial concentration variations. To the best of our knowledge, no example of QDs (with coordinating ligands) that are truly miscible with optical silicones exists.

In summary, a more general way of improving miscibility of QDs to optical silicones is highly desired. Hence, it is an aspect of the invention to provide an alternative nano particle-polymer system, especially a polymer quantum dot system. Especially, it is an aspect of the invention to provide an alternative process for the production of such polymer with embedded nano particles. Further, it is an aspect of the invention to provide an alternative light converter with nano particles embedded therein. Yet, it is a further aspect to provide an alternative lighting unit comprising such polymer with embedded QDs. Preferably, the alternative process and/or alternative light converter and/or alternative lighting unit at least partly obviate one or more of above-described (and also further below described) drawbacks of prior art solutions.

Surprisingly, the inventors have found amongst others that by exchanging the native QD ligands of light converter nano particles by particular PDMS-alike ligands, QDs may become truly miscible with silicones and/or significantly improves miscibility with silicones when specific conditions are met. Further, there is advantageously no need to use significant amounts of additional solvents such as hexane and acetone, or other solvents to obtain a well miscible system.

Hence, in a first aspect, the invention provides a process for the production of a light converter comprising a siloxane polymer matrix with light converter nano particles (herein also indicated as "nano particles") embedded therein, the process comprising:

(a) mixing (i) light converter nano particles having an outer surface grafted with grafting ligands and (ii) curable siloxane polymers, and (b) curing the curable siloxane polymers, thereby producing the light converter;

wherein the grafting ligands comprise siloxane having x1 Si backbone elements, wherein at least one Si backbone element of each siloxane grafting ligand comprises a side group having a grafting functionality, such as a side group selected from the group consisting of an amine comprising side group or an carboxylic acid comprising side group (though other functional groups are also possible, see below);

wherein the curable siloxane polymers have y1 Si backbone elements;

wherein x1 is especially at least 20, such as especially at least 40, even more especially at least 50, wherein y1 is especially at least 2, such as at least 7, like at least 10, and wherein especially $x1/y1 \geq 0.8$, such as $x1/y1 \geq 0.95$, such as >1, like at least $\geq 1.2$.

The nano particles are light converter nano particles, which may especially be configured to provide, upon excitation by UV and/or blue light, luminescence in at least part of the visible part of the spectrum. Hence, these particles are herein also indicated as light converter nano particles, of which QDs (quantum dots) are a specific embodiment.

Such light converter, obtainable by the herein described process, may show luminescence (when embedded in the matrix of cured siloxane polymers) with a high quantum yield and stability. Further, the light converter may be relatively temperature and/or photochemical stable and/or transparent. Further, with this process, nano particles may be dispersed in the polymer in a relative even way, without the substantial disadvantage of agglomeration.

Hence, in a further aspect, the invention also provides a light converter, obtainable by the process of the invention. Especially, the invention also provides the light converter (per se) comprising a (cured) siloxane polymer (matrix) with light converter nano particles embedded therein, wherein:

(a) the light converter nano particles have an outer surface grafted with ligands, and (b) the siloxane polymer matrix comprises cross-linked siloxane polymers;

wherein the ligands comprise siloxane grafting ligands having x1 Si backbone elements, wherein at least one Si backbone element of each siloxane grafting ligand comprises a side group having a grafting functionality (such as e.g. selected from the group consisting of an amine comprising side group or an carboxylic acid comprising side group);

wherein the curable siloxane polymers have y1 Si backbone elements;

wherein x1 is especially at least 20, such as especially at least 40, even more especially at least 50, like at least 80, wherein y1 is especially at least 2, such as at least 7, like at least 10, and wherein $x1/y1 \geq 0.8$, such as $x1/y1 \geq 0.95$, such as >1, like at least $\geq 1.2$.

As these light converters may well be applied in lighting devices, the invention provides in yet a further aspect a lighting device comprising:

a light source configured to generate light source light (i.e. light from the light source), a light converter obtainable by the process as defined herein and/or as defined per se, configured to convert at least part of the light source light into visible converter light.

In yet a further aspect, the invention also provides a liquid crystal display device comprising one or more backlighting units, wherein the one or more backlighting units comprise one or more lighting devices as defined herein.

The term light converter refers to a system that is configured to convert light from a first wavelength into light of a second wavelength. Especially, UV and/or blue light (excitation wavelength) may be (at least partially) converted into visible light (of higher wavelength than the excitation wavelength). This will further be elucidated below; first some aspects concerning the siloxane polymer, grafting ligands and curable siloxane polymers are described, as well as embodiments of a process to obtain the light converter.

Silicones, more precisely called polymerized or polymerizable siloxanes or polysiloxanes, are mixed inorganic-organic polymers with the chemical formula $[(R_1,R_2)SiO]_n$ (not taking into account the terminal groups), where R is a group such as for example hydrogen, hydrocarbon or fluorocarbon, especially methyl, ethyl, or phenyl. Especially, one or more R groups of one or more Si backbone elements comprise one or more of hydrocarbon and fluorocarbon. One or more of these side groups may also have cross-linking functionality, such as a vinyl group.

These polymerized siloxanes or polysiloxanes materials consist of an inorganic silicon-oxygen backbone ( . . . —Si—O—Si—O—Si—O— . . . ) with organic side groups attached to the silicon atoms, which are four-coordinate. As the R side groups may in principle be different, instead of the formula $[(R_2)SiO]_n$ also the formula $[(R1,R2)SiO]_n$ (not taking into account the terminal groups), might be applied. Note that herein x1 and y1 are applied for the number of Si elements in the siloxane backbone for the grafting ligands and (curable) siloxane polymers (that form the host material), respectively.

The fact that herein only R, or more precisely, R1,R2 are mentioned, does not exclude that different Si backbone elements may comprise the same side groups, but also more than two different types of side groups may be comprised by the silicone. Hence, R may for instance, but not limited to, be selected from the group consisting of methyl, phenyl, etc. Also halogens, mainly chlorine, are possible as side compound R. Further, $[R_2SiO]$, or $[—Si(R)_2—O—]$ refers to the silicone unit or silicone characterizing group (i.e. group that characterizes a silicone).

A siloxane is any chemical compound composed of units of the form $R_2SiO$, where R is for instance, but not limited to, a hydrogen atom, a hydrocarbon group, or one or more $R_2SiO$ unit(s) combined with a terminal group. Siloxanes can have branched or unbranched backbones consisting of alternating silicon and oxygen atoms —Si—O—Si—O— with side chains R attached to the silicon atoms. Polymerized siloxanes with organic side chains (R≠H) are commonly known as silicones or as polysiloxanes. Herein, these are also indicated as "siloxanes" or "siloxane polymers". Representative examples are $[SiO(CH_3)_2]_n$ (polydimethylsiloxane) and $[SiO(C_6H_5)_2]_n$ (polydiphenylsiloxane). These compounds can be viewed as a hybrid of both organic and inorganic compounds. The organic side chains confer hydrophobic properties while the —Si—O—Si—O— backbone is purely inorganic. As indicated above, Si elements in the backbone are herein also indicated as Si backbone elements. A $[R_2SiO]_n$ siloxane comprises n Si backbone elements. Hence, any siloxane characterizing moiety $R_2SiO$ provides one silicon backbone element (which has two side groups). Note that e.g. PDMS is $CH_3[Si(CH_3)_2O]_nSi(CH_3)_3$, has n+1 Si elements, thus in fact n+1 Si backbone elements. Would such siloxane be used as grafting ligand, x1=n+1; would such siloxane be used as silixane polymer for curing, y1=n+1. Further, PDMS (see formula) has n−1 non-terminal Si backbone elements.

By varying the —Si—O— chain lengths, side groups, and cross linking, silicones can be synthesized with a wide variety of properties and compositions. They can vary in consistency from liquid to gel to rubber to hard plastic.

The most common siloxane is linear polydimethylsiloxane (PDMS; see above), a silicone oil. The second largest group of silicone materials is based on silicone resins, which are formed by branched and cage-like oligosiloxanes.

Herein, especially linear siloxanes are used as curable siloxane polymers and/or siloxane grafting ligands. However, also non-linear siloxanes may be used as curable siloxane polymers and/or siloxane grafting ligands. Further, as the siloxanes are cured, in general the light converter will be a solid light converter (solid polymeric light converter). Nevertheless, the light converter might in an embodiment be flexible.

As indicated above, the grafting ligands comprise siloxane grafting ligands having x1 Si backbone elements; especially, the grafting ligands are siloxane grafting ligands (having x1 Si backbone elements). The term "grafting ligand" refer to a ligand that coordinates to or is bound to the outer surface of a light converter nano particle (these particles are further elucidated below), such as quantum dots. Grafting ligands are e.g. known in the art, and are for instance described in WO/2009/035657, WO/2010/014198 and WO/2008/063653, etc. Grafting ligands are sometimes also indicated as capping ligands.

The grafting ligands comprise siloxane molecules, which will in general have the commonly known side groups, but also have at least one side group having a grafting functionality. The side group having a grafting functionality may be selected from the group consisting of an amine and a carboxylic acid. For instance, the amine can be —$NH_2$ or COOH, but may also be —R—$NH_2$ or R—COOH, respectively, wherein R is a hydrocarbon, preferably comprising less than 20 carbon atoms. However, the side group having grafting functionality may also comprise a phosphine, a phosphine oxide, a phosphate, a thiol, etc. (and in embodiment combinations of two or more thereof). Hence, the grafting ligands are siloxane molecules, which will in general have the commonly known side groups, but also have at least one side group having a grafting functionality selected from the group consisting of an amine, a carboxylic acid, a phosphine, a phosphine oxide, a phosphate, a thiol, even more especially an amine, a carboxylic acid, a phosphine, a phosphine oxide, and a phosphate. The ligand may in an embodiment comprise a plurality of side group having a grafting functionality, which may comprise different types of such side groups (or which may be all identical). A Si backbone element may also comprise two side groups having a grafting functionality. The phrase "side group having a grafting functionality" refers to a side group (not a terminal group) which has the ability to graft to a luminescent nano particle, as describe herein. Therefore, the side group having grafting functionality provides to the siloxane its grafting ability (and thus grafting ligand functionality).

Hence, especially the side group is a side group of a non-terminal Si backbone element (see also below). The amine may be grafted as amine to the outer surface of the luminescent nano particle; the carboxylic acid may be grafted as carboxylate to the luminescent nano particle. Especially, it appears that the functional groups should especially be arranged as side groups and not as end groups. Hence, especially, the grafting ligands comprise siloxane molecules that have end groups which do not comprise a group selected from the group consisting of an amine, a carboxylic acid, a phosphine, a phosphine oxide, a phosphate, and a thiol; i.e. not having end groups which (substantially) have grafting functionality. The grafting ligands have especially side groups with grafting functionality for the herein indicated semiconductor quantum dots, especially the herein indicated CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs nanoparticles, even more especially the sulfides, tellurides and selenides.

The side groups having a grafting functionality may be arranged anywhere over the siloxane backbone of the grafting ligand. Assuming a linear siloxane with x1 silicon backbone units, then especially the one (or more) side group(s) having functional are found between 20-80% of the backbone length. Assuming for instance the backbone comprising 50 Si backbone elements, especially the side group having grafting functionality is found on Si no. 10, or Si no. 40 or in between (with no's 1 and 50 being end groups).

There is at least one such side group, though optionally there may be more than one side groups having a grafting functionality such as selected from the group consisting of an amine and a carboxylic acid, or others, such as a phosphine, a phosphine oxide, a phosphate, a thiol. The number of such side groups having a grafting functionality may depend upon the chain length of the siloxane grafting ligand, but especially does not exceed the number of 10. Hence, especially not more than up to 10 Si backbone elements (not being terminal Si backbone elements) of each siloxane grafting ligand comprise a side group having a grafting functionality. Especially not more than up to 10 Si backbone elements (not being terminal Si backbone elements) of each siloxane grafting ligand comprise a side group (having a grafting functionality) selected from the group consisting of an amine comprising side group, a carboxylic acid comprising side group, a phosphine comprising side group, a phosphine oxide comprising side group, a phosphate comprising side group, and a thiol comprising side group. When more than one side group having a grafting functionality is present, especially the percentage of side groups having a grafting functionality is equal to or less than 5 mole % (of all R1,R backbone side groups, not more than 5% comprises such functional group), even more especially the percentage of side groups having a grafting functionality is equal to or less than 2.5 mole %. Hence, assuming e.g. 22 Si backbone elements (thus including two terminal Si backbone elements), there are 40 side groups available; when 5% of them would have grafting functionality, this would imply that up to two side groups would have grafting functionality; the others would have no grafting functionality, such as methyl, phenyl, etc. These plurality (p) of side groups having grafting functionality can be distributed over p/2-p silicone backbone units.

Note that the terms "grafting ligand" or "siloxane grafting ligand" may also refer to a plurality of different types of grafting ligands. In an embodiment, these grafting ligands are substantially identical. However, in another embodiment, the grafting ligands may comprise a plurality of different grafting ligands. For instance, they may differ in chain length (x1), and/or they may differ in side groups, and/or they may differ in side groups having a grafting functionality, and/or may differ in the number of side groups having a grafting functionality and/or may differ in the position of side groups having a grafting functionality (and/or differ in the type of end groups). For instance, the siloxane grafting ligands may comprise a plurality of siloxane polymers, each having only one (amine) side group, but wherein the position of the (amine) side group is randomly distributed over the siloxane polymers.

In general, the curable siloxane polymers, or the (cross-linked) siloxane polymers of the light converter (polymeric) device) do not have one or more side groups having a grafting functionality selected from the group consisting of an amine and a carboxylic acid.

Except for the side groups having a grafting functionality, above indicated information with respect to the siloxane grafting ligands substantially also applies to the curable siloxane polymers.

The term "curable siloxane polymers" may also refer to a plurality of different types of curable siloxane polymers. In an embodiment, these curable siloxane polymers are substantially identical. However, in another embodiment, the curable siloxane polymers may comprise a plurality of different curable siloxane polymers. For instance, they may differ in chain length (y1), and/or they may differ in (the type of) side groups. Further, they may differ in the type of end group. The curable siloxane polymers may have end groups that are configured to form cross-links upon curing. Note that additionally or alternatively, also one or more side groups per curable siloxane polymer may be configured to form a cross-link upon curing. For instance, the side groups may include a vinyl group (or a hydrogen group). As can be understood from the above, the curable siloxane polymers may comprise end groups and/or side groups that are configured to form cross-links upon curing.

In a specific embodiment, x1 is at least 40, such as at least 50, especially at least 80. Better and/or more stable systems may then be obtained. In an embodiment, x1 is not larger than 2000, especially not larger than 1000, such as not larger than 800. In a specific embodiment, x1 is in the range of 40-1000, such as 40-800, like 100-800. As mentioned above, a combination of different grafting ligands may be applied; in such instance x1 is the (weight) average value.

Further, y1 is at least 7, such as especially at least 10, and especially not larger than 400, such as not larger than 200. As mentioned above, a combination of different curable siloxane polymers may be applied; in such instance y1 is the (weight) average value.

Further, good results may be obtained with $x1/y1 \geq 0.80$, but in general better results, in the sense of stability and/or transmission (of the light converter) are obtained when $x1/y1 \geq 0.95$, such as $x1/y1 \geq 1.2$.

Especially, the grafting ligands and curable siloxane polymers are chemically substantially identical. This may for instance imply that both the grafting ligands and curable siloxane polymers are poly methyl siloxanes or poly phenyl siloxanes or poly methylphenyl (especially 50/50) siloxanes, with the grafting ligands having at least one side group which is a side group having a grafting functionality.

In a specific embodiment, at least 75%, especially 80%, even more especially 85%, yet even more especially at least 90%, such as especially at least 95% of the side groups of the siloxane grafting ligands and curable siloxane polymers overlap in chemical identity. The overlap in chemical identity can be evaluated by determining the percentages of specific side groups on the grafting ligands and curable siloxane polymers and counting up the overlapping parts of the percentages. For instance in a hypothetical example, when a siloxane grafting ligand comprises 72% methyl and 25% phenyl side groups, and the curable siloxane polymers comprise 66% methyl and 29% phenyl side groups, than the sum of the overlapping percentages is 66%+25%=91%. Hence, such siloxane grafting ligands and curable siloxane polymers are substantially chemical identical.

As indicated above, the siloxane grafting ligands and/or curable siloxane polymers may comprise a plurality of different molecules, respectively. In such instance, mean values are used. For instance, assuming a first siloxane grafting ligand having 74% methyl and 22% phenyl side groups and a second siloxane grafting ligand having 70% methyl and 28% phenyl side groups, than the mean percentages are 72% methyl and 25% phenyl.

In a specific embodiment, at least 75%, especially 80%, even more especially 85%, yet even more especially at least 90%, such as especially at least 95% the Si backbone elements (not including terminal groups) of the siloxane grafting ligands have methyl side groups, and especially at least 75%, especially 80%, even more especially 85%, yet even more especially at least 90%, such as especially at least 95% the Si backbone elements (not including the terminal groups) of the (curable) siloxane polymers have methyl side groups. Hence, in an embodiment, the (solid) siloxane polymer (matrix) and the siloxane grafting ligands comprise poly dimethyl siloxane polymers. Assuming a siloxane comprising 10 silicon backbone units (not including the terminal groups), and 90% methyl side groups, 16 methyl side groups will be present.

Especially, the siloxanes for both grafting ligand and the curable siloxane polymers are 100% methyl side groups, or 50/50 methyl/phenyl side groups (with for the grafting ligands at least one side group is however a side group having grafting functionality, thus such side group is not only methyl or phenyl, but comprises alternatively or additionally for instance an amine or carboxylic acid).

In yet another embodiment, at least 75%, especially 80%, even more especially 85%, yet even more especially at least 90%, such as especially at least 95% the Si backbone elements (not including the terminal groups) of the siloxane grafting ligands have phenyl side groups and at least 75%, especially 80%, even more especially 85%, yet even more especially at least 90%, such as especially at least 95% the Si backbone elements (not including the terminal groups) of the siloxane polymers have phenyl side groups.

As will be clear, the terminal groups may also comprise methyl, phenyl, or other groups, such as optionally groups having cross-link functionality.

The quantum dots or luminescent nanoparticles, which are herein indicated as light converter nanoparticles, may for instance comprise group II-VI compound semiconductor quantum dots selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of $CuInS_2$, $CuInSe_2$, $CuGaS_2$, $CuGaSe_2$, $AgInS_2$, $AgInSe_2$, $AgGaS_2$, and $AgGaSe_2$. In yet a further embodiment, the luminescent nanoparticles may for instance be I-V-VI2 semiconductor quantum dots, such as selected from the group consisting of $LiAsSe_2$, $NaAsSe_2$ and $KAsSe_2$. In yet a further embodiment, the luminescent nanoparticles may for instance be a group IV-VI compound semiconductor nano crystals such as SbTe. In a specific embodiment, the luminescent nanoparticles are selected from the group consisting of InP, $CuInS_2$, $CuInSe_2$, CdTe, CdSe, CdSeTe, $AgInS_2$ and $AgInSe_2$. In yet a further embodiment, the luminescent nanoparticles may for instance be one of the group II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

In an embodiment, Cd-free QDs are applied. In a specific embodiment, the light converter nano-particles comprise III-V QDs, more specifically an InP based quantum dots, such as a core-shell InP—ZnS QDs. Note that the terms "InP quantum dot" or "InP based quantum dot" and similar terms may relate to "bare" InP QDs, but also to core-shell InP QDs, with a shell on the InP core, such as a core-shell InP—ZnS QDs, like a InP—ZnS QDs dot-in-rod.

The luminescent nanoparticles (without coating) may have dimensions in the range of about 2-50 nm, especially 2-20 nm, such as 5-15 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 5-15 nm). The term "dimensions" especially relate to one or more of length, width, and diameter, dependent upon the shape of the nanoparticle.

In an embodiments, the light converter nanoparticles have an average particle size in a range from about 1 to about 1000 nanometers (nm), and preferably in a range from about 1 to about 100 nm. In an embodiment, nanoparticles have an average particle size in a range from about 1-50 nm, especially 1 to about 20 nm, and in general at least 1.5 nm, such as at least 2 nm. In an embodiment, nanoparticles have an average particle size in a range from about 1 to about 20 nm.

Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or CuInSe$_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. For instance, core-shell particles and dots-in-rods may be applied and/or combinations of two or more of the afore-mentioned nano particles may be applied, such as CdS and CdSe. Here, the term "different types" may relate to different geometries as well as to different types of semiconductor luminescent material. Hence, a combination of two or more of (the above indicated) quantum dots or luminescent nano-particles may also be applied.

One example, such as derived from WO 2011/031871, of a method of manufacturing a semiconductor nanocrystal is a colloidal growth process. Colloidal growth occurs by injection an M donor and an X donor into a hot coordinating solvent. One example of a preferred method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

In an embodiment, the surrounding "shell" material can have a band gap greater than the band gap of the core material. In certain other embodiments, the surrounding shell material can have a band gap less than the band gap of the core material.

In an embodiment, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific light converter nanoparticles, based on semiconductors.

Hence, the above-mentioned outer surface may be the surface of a bare quantum dot (i.e. a QD not comprising a further shell or coating) or may be the surface of a coated quantum dot, such as a core-shell quantum dot (like core-shell or dot-in-rod), i.e. the (outer) surface of the shell. The grafting ligand thus especially grafts to the outer surface of the quantum dot, such as the outer surface of a dot-in-rod QD.

Therefore, in a specific embodiment, the light converter nanoparticles are selected from the group consisting of core-shell nano particles, with the cores and shells comprising one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

In general, the cores and shells comprise the same class of material, but essentially consist of different materials, like a ZnS shell surrounding a CdSe core, etc.

Herein, the term "solid polymer" is used, as to indicate that the polymeric end product of the process of the invention is not a liquid or a solved polymer, but a tangible product (at room temperature (and atmospheric pressure)) in the form of for instance particles, a film, a plate, etc. Hence, in an embodiment, the light converter is selected from the group consisting of a coating, a self-supporting layer, and a plate; which light converter is thus especially solid at room temperature, especially even up to 100° C., especially even up to 150° C., especially even up to 200° C.). The light converter may be flexible or may be rigid. Further, the light converter may be flat or curved (in one or two dimensions). Further, optionally the light converter may comprise out-coupling structures at at least part of the external surface of the light converter.

The process of the invention at least comprises two process elements, which will in general be executed consecutively, with the first process element preceding the second process element. The fact that two process elements are explicitly mentioned, does not exclude the presence of one or more other process elements, which may be included in the process before the first process element, and/or between the first and the second process element, and/or after the second process element. For instance, the process of the invention may also include an exchange of existing grafting molecules on the quantum nano particle with grafting molecules as defined in the present invention. This process may further optionally include removal of excess ligands (i.e. ligands that are not bound to light converter nano particles.

The first process element includes the mixing of the grafted nano particles (i.e. the converter nano particles having an outer surface grafted with the grafting ligands) and the curable siloxane polymers. In the general, this could be accelerated or optimized in the presence of a liquid wherein the QDs may be dispersed and which is especially a solvent for the curable siloxane polymers. Herein, a solvent is considered to be a solvent when at room temperature at least 0.1 gram/l of a species to be solved can be solved in the solvent. The solvent could be any common, preferably non-polar, solvents with preferably a boiling point lower than 120° C. For instance, the solvent could be toluene, benzene, hexane, cyclohexane, etc. The solvent could be a polar solvent. For instance, the solvent could be chloroform, acetone, acetone nitrile, ethyl acetate, petroleum ether, etc. Mixing may be done with conventional techniques. Optionally, the mixture may be heated.

Curing may be done with techniques known in the art. As indicated above, to this end at least part of the curable siloxane polymers may have reactive groups that are configured to form cross-links upon curing. Curing may be assisted by a catalyst. Further, the mixture may be heated and/or irradiated to initiate and/or propagate curing. By curing, a (solid) matrix or host for the grafted light converter nano particles is obtained (the latter being embedded and distributed in the former).

As suggested above, the process of the invention may provide a (luminescent) light converter comprising a (solid) polymer within the polymer article embedded light converter nano particles having an outer surface grafted with grafting molecules. As indicated above, the (luminescent) light converter may for instance be transparent or translucent, especially substantially transparent. The process of the invention may lead in an embodiment to a product wherein at least part of the grafting ligand is interwoven (via e.g. cross-links) with siloxane polymer(s). The latter embodiment may be the case when the grafting ligands may be able to react with the curable (or cured) siloxane polymers. Hence, in an embodiment, one or more grafting ligands may comprise functional groups that are configured to form cross-links with especially the curable siloxane polymers (that form the host material or matrix).

The process of the invention may thus also provide the herein defined light converter (or light converter element) with light converter nano particles embedded therein. Hence, the herein defined light converter (or light converter element), with light converter nano particles embedded therein, is in an embodiment obtainable by the process as defined herein. Therefore, as indicated above, in a further aspect, the invention provides a light converter comprising a siloxane polymer matrix with light converter nano particles embedded therein, wherein:

(a) the light converter nano particles have an outer surface grafted with grafting ligands, and (b) the siloxane polymer matrix comprises cross-linked siloxane polymers;

wherein the grafting ligands comprise siloxane grafting ligands having x1 Si backbone elements, wherein at least one Si backbone element of each siloxane grafting ligand comprises a side group having a grafting functionality selected from the group consisting of an amine comprising side group or an carboxylic acid comprising side group;

wherein the curable siloxane polymers have y1 Si backbone elements;

wherein x1 is especially at least 20, such as especially at least 40, even more especially at least 50, wherein y1 is especially at least 2, such as at least 7, like at least 10, and wherein especially $x1/y1 \geq 0.8$, such as $x1/y1 \geq 0.95$, such as >1, like at least $\geq 1.2$.

Especially, the light converter comprises 0.001-25 wt. % light converter nanoparticles relative to the total weight of the light converter, such as 0.1-20 wt. %, especially not more than 5 wt. %, such as 0.1-2 wt. %.

Especially, the matrix of the cured (curable) siloxane polymers is transmissive for light having a wavelength selected from the range of 380-750 nm. For instance, the matrix of the cured (curable) siloxane polymers may be transmissive for blue, and/or green, and/or red light. Especially, the matrix of the cured (curable) siloxane polymers is transmissive for at least the entire range of 420-680 nm. Especially, the matrix of the cured (curable) siloxane polymers has a light transmission in the range of 50-100%, especially in the range of 70-100%, for light generated by the light source of the lighting unit (see also below) and having a wavelength selected from the visible wavelength range. In this way, the matrix of the cured (curable) siloxane polymers is transmissive for visible light from the lighting unit. The transmission or light permeability can be determined by providing light at a specific wavelength with a first intensity to the material and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989). The light converter may be transparent or translucent, but may especially be transparent. Especially, the light converter is substantially transparent and/or does not substantially scatter light. When the light converter is transparent, light of the light source may not entirely be absorbed by the light converter. Especially when using blue light, this may be of interest, as the blue light may be used to excite the light converter nano particles and may be used to provide a blue component (in white light). Hence, especially curable siloxane polymers are applied that provide a substantially transmissive matrix (or host) for the light converter nano particles.

Further, as stated above, the invention also provides a lighting unit comprising (i) a light source configured to generate light source light and (ii) a light converter configured to convert at least part of the light source light into converter light, wherein the light converter comprises the solid polymer obtainable according to the process as defined herein or the light converter as defined herein. Hence, in a further aspect, the invention provides a lighting device comprising:

a light source configured to generate light source light, a light converter obtainable by the process as defined herein or the light converter per se as defined herein, configured to convert at least part of the light source light into visible converter light.

It may be advantageous, in view of efficiency and/or stability, to arrange the nano particles, or especially the light converter, at a non-zero distance, such as 0.5-50 mm, like 1-50 mm, from the light source. Hence, in an embodiment, the light converter may be configured at a non-zero distance of the light source. For instance, the light converter, or especially the luminescent material, may be applied to or may be comprised by a window of the lighting unit. In case the light source is configured to provide blue light, the luminescent material may be configured to convert only part of the light source light. The blue light of the light source and the luminescent material light of the light converter nano particles based luminescent material together may in an embodiment provide white lighting unit light. Hence, in an embodiment, the light converter is configured at a non-zero distance from the light source. Note however that the invention is not limited to applications wherein the distance between the light converter and the light source is non-zero. The invention, and the herein described specific embodiments, may be also applied in other embodiments wherein the light source and light converter are in physical contact. In such instances, the light converter may especially be configured in physical contact with e.g. a LED die.

In a further embodiment, the light source comprise a solid state light source, such as a solid state light emitting device or solid state laser. The term light source may also relate to a plurality of light sources.

As indicated above, the lighting device might be applied as back lighting unit in an LCD application. Hence, the invention provides in a further aspect a liquid crystal display device comprising a back lighting unit, wherein the back lighting unit comprises one or more lighting devices as defined herein.

In addition to the light converter nano particles, the light converter may comprise host other (particulate) materials, such as for instance one or more of an organic dye and reflective (non luminescent) particles, like $TiO_2$. Such (particulate) material(s) may be mixed with the light converter nano particles and the curable siloxane polymers. Hence, the phrase "mixing (i) light converter nano particles (herein also indicated as "nano particles") with an outer surface grafted with grafting ligands and (ii) curable siloxane polymers" may also relate to "mixing (i) light converter nano particles (herein also indicated as "nano particles") with an outer surface grafted with grafting ligands and (ii) curable siloxane polymers, and optionally one or more other materials".

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relate to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-590 nm. The terms "orange light" or "orange emission" especially relate to light having a wavelength in the range of about 590-620. The terms "red light" or "red emission" especially relate to light having a wavelength in the range of about 620-750 nm. The terms "visible" light or "visible emission" refer to light having a wavelength in the range of about 380-750 nm.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

The drawings are not necessarily on scale.

Figure 4A:
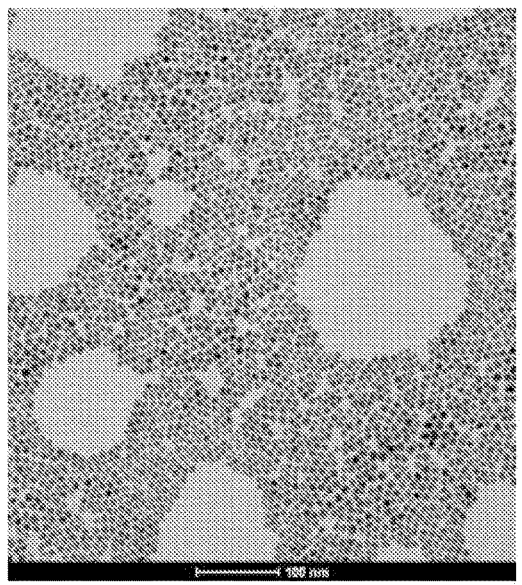
Figure 4B:
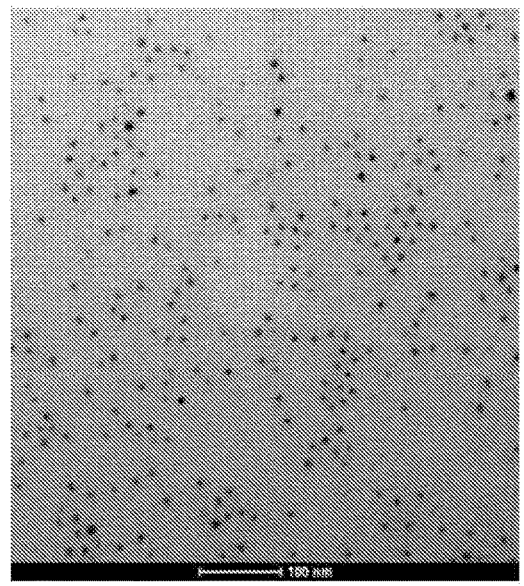

FIGS. 4a and 4b show TEM pictures of QDs before and after exchange of grafting ligands according to the invention, respectively.

Figure 5:
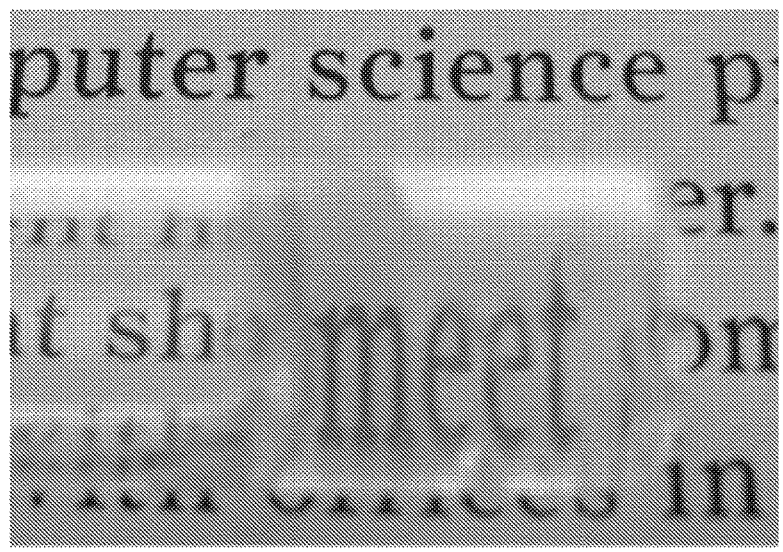

FIG. 5 shows a photograph of a silicone gel comprising QDs after exchange of grafting ligands according to the invention.

DETAILED DESCRIPTION OF THE EMBODIMENTS

Figure 1A:
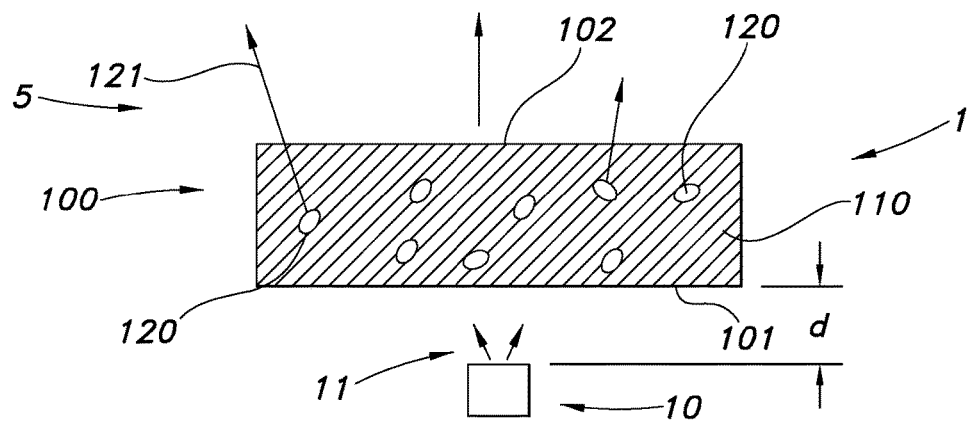
FIGS. 1a-1c schematically depict some aspects of the device(s) of the invention.

FIG. 1a schematically depicts a lighting device 1 comprising a light source 10 configured to generate light source light 11 and a light converter 100 configured to convert at least part of the light source light 11 into visible converter light 121. Here schematically only one light source 10 is depicted. However, more than one light source 10 may be present.

The light converter has an upstream side 101 (part of an external surface of the light converter), which is at least partly directed to the light source 10, and a downstream side 102 (part of an external surface of the light converter), which faces away from the light source 10 (in this transmissive configuration).

The light converter 100 comprises a polymeric host material 110 with light converter nanoparticles 120 embedded in the polymeric host material 110. These can be dots, rods, a combination thereof, etc. (see also above). The light converter nanoparticles 120 generate upon excitation by the light source light 11 visible converter light (and optionally also non-visible radiation, like IR radiation). At least part of the converter light 121 escapes from the downstream side 102 as lighting device light 5. This lighting device light 5, of which at least part is in the visible, at least contains part of the converter light 121, and may optionally also contain some remaining light source light 11.

FIG. 1a schematically depicts the lighting device in operation.

Figure 1B:
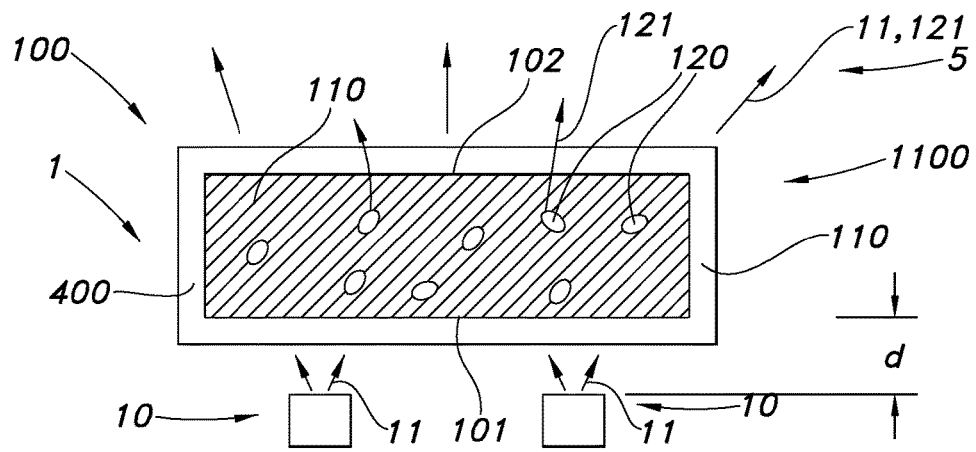

FIG. 1b schematically depicts another embodiment, wherein the light converter 100 is encapsulated. An encapsulation 400 encloses the light converter; this encapsulation may substantially block oxygen (and/or $H_2O$) transporter from the atmosphere to the light converter. This may add to the stability of the light converter nanoparticles 120 (and the polymeric host). The combination of light converter 100 and encapsulation 400 is herein also indicated as light converter unit 1100.

Figure 1C:
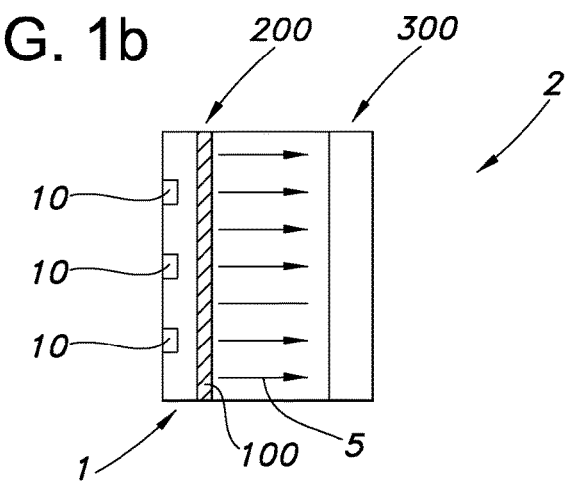

FIG. 1c schematically depicts one of the applications of the lighting unit 1, here in a liquid crystal display device 2, which comprises a back lighting unit 200 which comprises one or more lighting units 1 (here, one lighting unit is schematically depicted), as well as a LCD panel 300, which can be backlighted with the lighting device light 5 of the lighting unit(s) 100 of the back lighting unit 200.

The converter 100 may especially be arranged at a non-zero distance d from the light source 10, which may for instance be a light emitting diode, although the distance d may also be zero, for instance when the luminescent material 30 is applied on a LED die or embedded in a (silicone) cone on the LED die. The converter may optionally allow at least part of the light source light 21 penetrate through the converter. In this way, downstream of the converter, a combination of converter light 121 and light source light 11 may be found. The light downstream of the light converter is indicated a lighting device light 5. The distance d may especially be in the range of 0.1-100 mm, especially 0.5-100 mm, such as 1-20 mm, like especially 1-50 mm, like about 1-3 for applications close by the light source and 5-50 mm for more remote applications. Note however that the invention is not limited to applications wherein d>0. The invention, and the herein described specific embodiments, may be also applied in other embodiments with d=0. In such instances, the light converter may especially be configured in physical contact with the LED die.

In addition to the ligand grafted semiconductor based light converter nano particles 120, the light converter 100 may optionally comprise also other types of luminescent materials, for instance to tune the color of the lighting unit light 5, to increase the color rendering, to tune the color temperature, etc.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

Figure 2A:
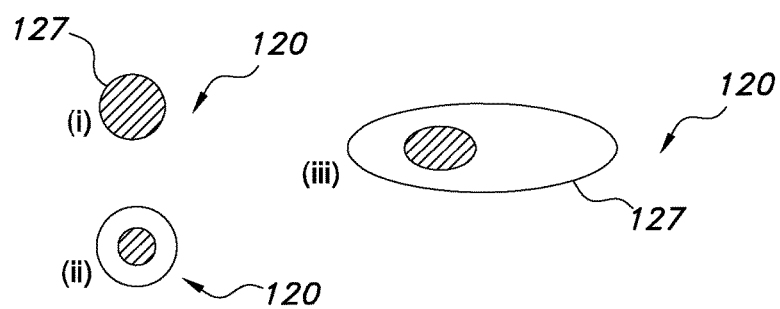
FIGS. 2a-2d schematically depict some further aspects of the invention.

FIG. 2a schematically depict a non-limiting number of examples of light converter nano particles 120, here quantum dots (QDs). By way of example, (i) indicates a QD particle, having the shape of a dot, without further layers. For instance, this may be e.g. CdSe. Grafting ligands are not shown for the sake of clarity (see below). The QD example (ii) schematically depicts a core shell system, by way of example (CdSe)ZnS (core)shell. The QD example (iii) schematically depicts a dot in rod QD system, e.g. (CdS)ZnS dot in rod (which is also a type of core-shell QD). The light converter nano particles have an outer surface indicated with reference 127.

Figure 2B:
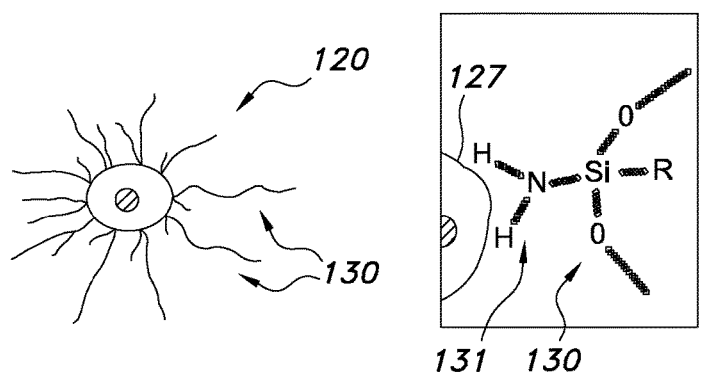

FIG. 2b schematically depicts a QD with grafting ligand. As can be seen, in this example the side groups having a grafting functionality (the group is indicated with reference 131) are not end groups; the grafting ligands are attached to the outer surface 127 of the light converter nano particles. Hence, the grafting ligands may have (at least) two tails. Would the grafting ligands have more than one side group having a grafting functionality, other (more complex) structures may be found. In the insert, an enlargement is shown, with two tails at both sides of the silicone backbone element that bears the side group having a grafting functionality that binds to the outer surface 127 of the light converter nano particle.

Figure 2C:
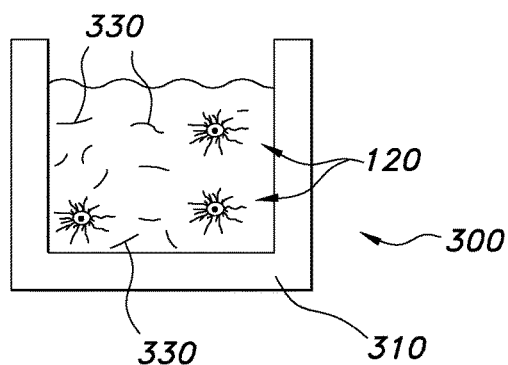

FIG. 2c very schematically depicts the situation before curing, wherein for instance the light converter nano particles with grafting ligands bound to the outer surface of the nano particles as well as uncured siloxane polymers, indicated with reference 330, are distributed in a liquid in the vessel, which is indicated with reference 300. The liquid is indicated with reference 31; it may be used to disperse the grafted nano particles 120; further, it may be applied to solve the curable siloxane polymers.

Figure 2D:
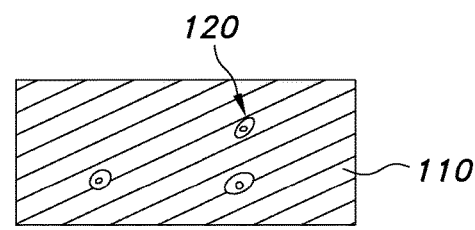

After curing, such as by heating and in the presence of a catalyst (for the sake of clarity not depicted) in the mixture in the vessel, the cured system is obtained, i.e. the light converter, as schematically depicted in FIG. 2d. The cured siloxane polymers, now forming a silicone, are considered the polymeric host material 110 for the light converter nano particles 120, such as QDs (see also above).

FIGS. 3a-3h are discussed further below in the course of the experimental part.

Figure 3A:
FIGS. 3a-3j schematically depict some further aspects of siloxanes and some further aspects of the invention.
Figure 3B:
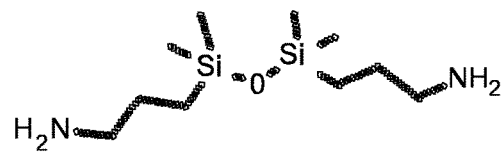
Figure 3C:
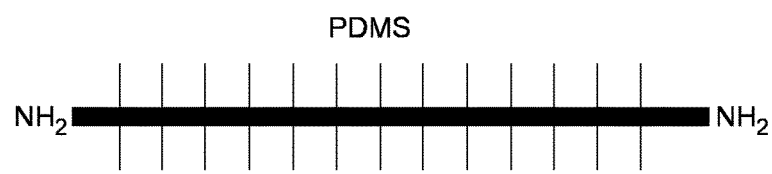
Figure 3D:
Figure 3E:
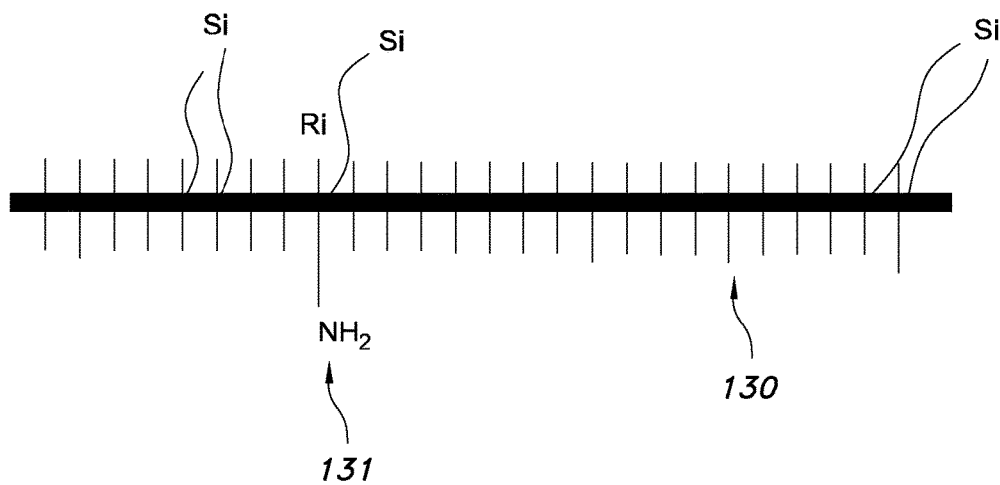
Figure 3F:
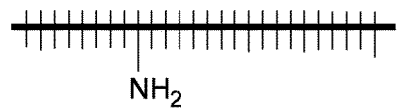
Figure 3G:
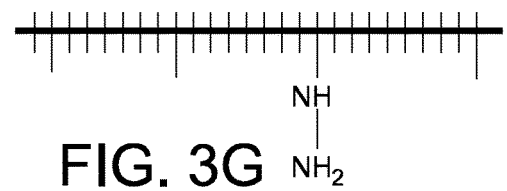
Figure 3H:
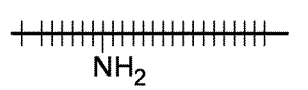
Figure 3H:
Figure 3H:
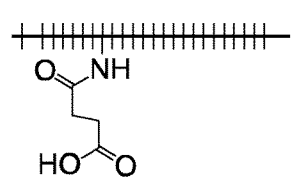
Figure 3I:
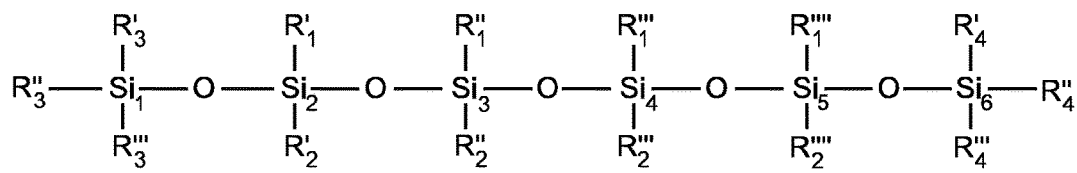

FIG. 3i very schematically depicts part of a siloxane polymer, with only 6 silicone backbone elements depicted; Si backbone elements 1 and 6 are terminal groups, with e.g. terminal end groups $R_3'$-$R_3'''$ and end groups $R_4'$-$R_4'''$, respectively. These terminal end groups may comprise e.g. (one or more of) OH, methyl, phenyl, vinyl, hydrogen, etc. etc., as known in the art. Each (non-terminal) silicone backbone element has two side groups, which can in principle all be different, but which can also all be the same, except for the fact that the grafting ligand has at least one side group having a grafting functionality as defined above.

Figure 3J:
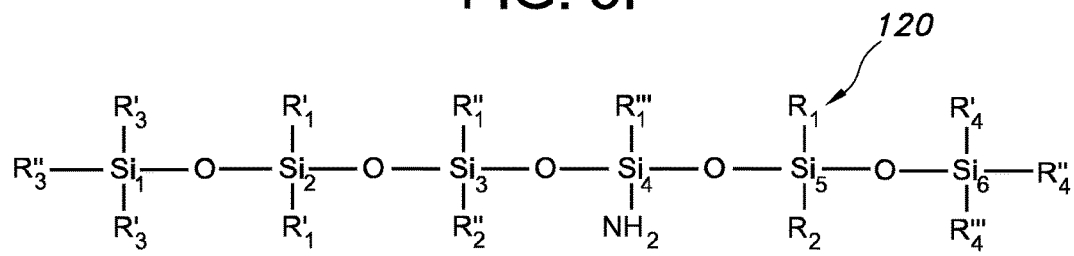
Figure 3J:
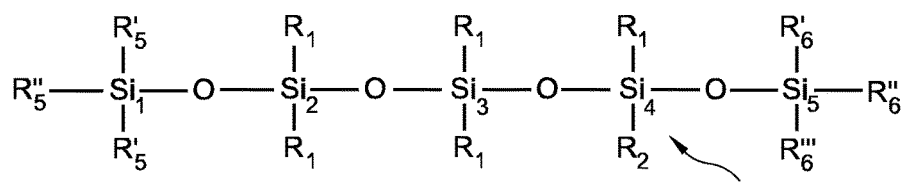

FIG. 3j is shown to indicate how the chemical overlap can be determined. As indicated above, especially at least 75%, especially 80%, even more especially 85%, yet even more especially at least 90%, such as especially at least 95% of the side groups of the siloxane grafting ligands and curable siloxane polymers overlap in chemical identity. R3'-R3", R4'-R4''', R5'-R5" and R6'-R6''' are end groups, and are not considered when evaluating the chemical overlap of the side groups. FIG. 3j schematically shows simple (but common) systems with only two different side groups. The grafting ligand has by way of example 4 non-terminal silicone backbone elements (and two terminal Si backbone elements); the curable siloxane polymer has by way of example 3 silicone backbone elements (and two terminal Si backbone elements). The grafting ligand has by way of example one side group having a grafting functionality (FSG). In below table, the overlap in chemical identity is displayed. Note that in columns II and V only number of the non-terminal Si backbone elements is given, as only these can provide side groups; the terminal Si backbone elements have end groups.

| I | II No Si. | III No. R1 | IV % R1 | V No. R2 | VI % R2 | VII FSG | VIII % FSG | IX Sum % |
|---|---|---|---|---|---|---|---|---|
| Grafting ligand | 4 | 5 | =5/ (2 * 4) * 100% = 62.5% | 2 | =2/ (2 * 4) * 100% = 25% | 1 | =1/ (2 * 4) * 100% = 12.5% | 100% |
| Curable siloxane polymer | 3 | 5 | =5/ (2 * 3) * 100% = 83.3% | 1 | =1/ (2 * 3) * 100% = 16.7% | 0 | 0 | 100 |
| Overlap | | | 62.5% | | 16.7 | | 0 | 79.2 |

Hence, here the chemical overlap is 79.2%. In practice, the chemical overlap will in general be higher, such as at least 90%.

EXPERIMENTAL

Experimental Results Quantum Dots in Silicones
Examples of Ligands with Various Sizes and Functional Groups In our search for compatible QD-ligand/silicone systems we have systematically investigated up to 20 ligands of different composition/functionality, and up to 10 different silicones. Roughly, the ligands can be classified as:
Short monofunctional siloxane (e.g. 3-Aminopropylpentamethyldisiloxane, AB129258; supplier ABCR); see FIG. 3a;

Short bifunctional siloxane (e.g. 1,3-Bis(3-aminopropyl) tetramethyldisiloxane, AB 110832); see FIG. 3b;
Endfunctionalized PDMS with amine or acid on both ends ("symmetric", e.g. Polydimethylsiloxane, aminopropyl terminated, AB111872); see FIG. 3c;
Endfunctionalized PDMS with amine or acid on one end ("asymmetric", e.g. Monocarboxydecyl terminated polydimethylsiloxane, asymmetric, AB 252409); see FIG. 3d;
Side-functionalized PDMS with amine or acid (2-3% Aminopropylmethylsiloxane)-dimethylsiloxane copolymer, AB109373); see FIG. 3e, with reference 131 referring to the side group having a grafting functionality.

In all cases, a small amount of QDs in toluene was added to 1 ml of the pure ligand, which gave very turbid mixtures is nearly all cases. The mixture was stirred for more than 12 hours at 100° C. In most cases, the pure ligand-QD mixture became transparent within an hour, which provides evidence for ligand exchange. After cooling, this mixture was directly added to the various silicones, and the degree of mixing was determined by visual inspection of the obtained mixture. In contrast to experiments in examples further on in this document, the QDs were not purified from the excess ligands in the experiments described here. An overview of all ligands tested can be found in the table below.

It was observed that only QDs with side-functionalized ligands (the last category) gave improved miscibility with the selected silicones. It was later found that ligands very similar to AB109373 (AB109374, AB124359, AB116669 (latter two are branched)) showed similar transparent mixtures. The common factor is that it involves PDMS chains with on average 1 amine group (randomly distributed) in the side chain, and with a molecular weight of ~5000-1000, corresponding to a viscosity of 100-300 cSt. An illustration of these molecules is given in FIGS. 3f and 3g.

From the experiments above it appears that short ligands, and/or end-functionalized ligands did not show an improved miscibility with silicones. The effect of long versus short ligands is explained in more detail below. For that purpose, we have tested once again two long-chain end-functionalized siloxane ligands (the AB109371 and 153374 with viscosity 100 and 1000 cSt respectively), but it was found that the ligand exchange itself was not successful, i.e. the QD-ligand mixture did not become transparent over time.

In summary, the results clearly show that side-functionalized siloxane ligands are preferred.

The chemical compatibility will be discussed in more detail below:

| Reference | Type | Viscosity | Molecular Weight | n (x1 or y1) |
|---|---|---|---|---|
| | AMINES | | | |
| AB250914 | Polydimethylsiloxane, monoaminopropyl terminated; 95%, viscosity | 7-14 cSt. | 800-1100 | 14 |
| AB111872 | Polydimethylsiloxane, aminopropyl terminated; viscosity | 20-30 cSt | 900-1000 | 14 |
| AB109369 | Polydimethylsiloxane, aminopropyl terminated; 3.2-3.8% amine, viscosity | 10-15 cSt. | 850-900 | 12 |
| AB153374 | Polydimethylsiloxane, aminopropyl terminated; 0.11-0.12% amine, viscosity | 900-1100 cSt | 15000-20000 | 236 |
| AB109373 | (2-3% Aminopropylmethylsiloxane) - dimethylsiloxane copolymer; viscosity | 80-200 cSt. | 4000-6000 | 68 |
| AB109374 | (4-5% Aminopropylmethylsiloxane) - dimethylsiloxane copolymer; viscosity | 150-300 cSt. | 7000-9000 | 108 |
| AB109371 | Polydimethylsiloxane, aminopropyl terminated, 0.6-0.7% amine; | 100-120 | 5000-7000 | 378 |
| AB129258 | 3-Aminopropylpentamethyldisiloxane; 97% | | | 2 |
| AB110832 | 1,3-Bis(3-aminopropyl)tetramethyldisiloxane; 97% | | | 2 |
| AB129067 | 3-Aminopropylmethylbis(trimethylsiloxy)silane; 97% | | | 2 |
| AB116669 | (0.5-1.5% AMINOETHYLAMINOPROPYLMETHOXYSILOXANE) - DIMETHYLSILOXANE COPOLYMER WITH BRANCH STRUCTURE, | 100-200 cSt | 4000-6000 | 68 |
| AB116668 | (2-4% AMINOETHYLAMINOPROPYLMETHYLSILOXANE) - DIMETHYLSILOXANE COPOLYMER, | 900-1,200 cSt | 28000 | 81 |
| AB124359 | (2-4% AMINOETHYLAMINOPROPYLMETHOXYSILOXANE) - DIMETHYLSILOXANE COPOLYMER WITH BRANCH STRUCTURE ACIDS | 200-300 | 6000-9000 | 101 |
| AB252409 | Monocarboxydecyl terminated polydimethylsiloxane, asymmetric, | 20 cSt. | 1200-1800 | 17 |
| AB128267 | Polydimethylsiloxane, carboxydecyldimethyl terminated; viscosity | 15-50 cSt. | 1000 | 17 |
| AB116682 | Polydimethylsiloxane, carboxypropyl terminated, | 800-1200 | 28000 | 378 |
| AB111537 | Trimethylsilylpropionic acid; 97% | ~1 | 142 | 1 |
| AB110833 | 1,3-Bis(3-carboxypropyl)tetramethyldisiloxane; 97% | | | 2 |
| AB111511 | 2-(Trimethylsilyl)acetic acid | | | 2 |

Custom Synthesized Ligand with a Carboxylic Acid Group, Based on the AB109373 Molecule The successful examples above of ligands with functional groups in the side-chain are based on amine functional groups. However, it is known that carboxylic acid side-groups are more preferred in view of QD-stability. In addition, it is observed that excess amine ligands inhibit the silicone curing reaction, whereas excess carboxylic acid ligands don't do so. Thus, a molecule similar to e.g. AB109373 but with a carboxylic acid instead of an amine side-group and with a viscosity of 100-300 cSt and similar molecular weight is most preferred. The molecule may be branched or not branched. However, such molecules are not available commercially to the best of our knowledge. We have therefore custom-synthesized this molecule by reacting an anhydride moiety to the amine group of the AB109373 ligand. The reaction and resulting carboxy-ligand is shown in FIG. 3h (conversion of the AB109373 ligand into a carboxy-functionalized ligand by reaction with succinic anhydride).

We have tested the custom synthesized AB109373-COOH ligand. Upon mixing CdSe quantum dots with the non-diluted AB109373-COOH ligand a poor miscibility was again observed. However, the mixture became transparent already after a few minutes at 100° C. This higher reactivity may be due to the carboxylic acid group compared to an amine group, or the fact that the side-chain is slightly more extended. This is an important proof that also PDMS ligands with a carboxylic side-chain group can be used.

This experiment was repeated with the AB109373-COOH ligand diluted in a hydrocarbon solvent (dodecane), and again clear mixtures were obtained after heating at 100° C., down to a concentration of 1 wt. % of the ligand in the solvent. Typically ligand concentrations of 5-10 wt. % were used in the experiments.

This experiment was again repeated with InP quantum dots in a diluted AB109373-COOH ligand solution (5 wt. % of AB109373-COOH ligand in a solvent). Again a transparent mixture was obtained after the ligand exchange.

Before mixing into other silicones, the system of the light converter nano particles with grafting ligands (in toluene) was purified by substantially removing excess ligand.

TEM on Dried-in QDs with the AB109373 Custom Ligand on a Grid—Evidence for Ligand Exchange Including Washing Procedure.

FIG. 4a shows a TEM image of washed CdSe quantum dots, prepared following the method as described by Lim et al. (Advanced Materials, 2007, 19, p. 1927-1932), and dried on a TEM grid. FIG. 4b shows a TEM image of CdSe quantum dots, from the same batch as shown in FIG. 4a, after ligand exchange with the AB109373 custom ligand.

FIG. 4a shows that the quantum dots before ligand exchange have an interparticle distance of about 1 nm. FIG. 4b shows that the quantum dots after ligand exchange and formed in 2-dimensional aggregates during the drying process, are placed well apart from each other having an interparticle distance of about 7-8 nm. The latter indicates that the thickness of the ligand layer on the quantum dots is around 3.5-nm. Typically 4-5 nm interparticle distances are observed.

A similar result was observed for washed CdSe quantum dots after ligand exchange where the ligand was diluted with a solvent, in this case a slightly shorter interparticle distance of about 3 nm was observed. The interparticle distance that is achieved may depend on the degree of ligand exchange, amongst others.

A similar result was observed when using InP quantum dots after ligand exchange.

TEM of QDs without Ligand Exchange in Various Silicones—Evidence for Big Aggregates If CdSe quantum dots, as prepared according to the method of Lim et. al. (Advanced Materials, 2007, 19, p. 1927-1932), are mixed into silicones often immediately strong flocculation is observed. Large aggregates are formed and even if layers appear transparent to the naked eye, microscopy reveals that aggregates are present.

Examples of QDs with Long Ligand (x1=68) in Siloxanes with Various Chain-Lengths, Using Purified QDs The purified QDs redispersed in toluene could be mixed with pdms with low molecular weights to create stable dispersions. The dots could be dispersed in a pdms with a molecular weight of 1250, 2000, 3800 and 6000 (corresponding viscosities of 10, 20, 50 and 100 cSt or 17, 27, 50, 80 Si backbone units)) to yield non-scattering dispersions. In a 200 cSt (Mw 9430, y1=127) pdms the sample was scattering.

Similar results were obtained with the CdSe quantum dots where a lower ligand concentration was used during the ligand exchange.

Similar results were obtained with ligand exchanged InP quantum dots.

Examples of QDs with Short Ligand in Siloxanes with Various Chain-Lenghts

We modified QDs with a short end-functionalized siloxane ligand (monoaminopropyl terminated, AB 250914 with a viscosity of 7-14 cSt and Mw of 800-1100, x1=12)).

The ligand exchange was successful, i.e. the QD-ligand mixture was transparent after ligand exchange (>12 h @ 100° C.). It was observed that upon mixing, the QDs with the AB250914 ligand remain fully transparent in the 10 cSt PDMS (y1=17) for about 30 seconds, after which it starts to flocculate gradually, and becomes turbid eventually. This result was reproduced several times. It is interpreted as that the ligands are just below the threshold of being sufficiently long to stabilize the QDs in the 10 cSt PDMS. As a result, the mixture is initially stable, but slowly starts to flocculate over time. When mixed with 100 cSt, (y1=80) this gave a turbid suspension immediately, as expected.

Examples of QDs with Long Ligand in Siloxanes with Various Type of Siloxane Groups.

To investigate the importance of chemical compatibility between the ligand and siloxane polymer, the QDs with the custom AB109373-COOH ligand (x1=68) were mixed with siloxane molecules with various sidegroups. An overview is given in the table below.

The results in the table below once more confirm that the QDs with the AB109373-COOH ligand form a transparent mixture with PDMS siloxane molecules up to a viscosity of 100 cSt (y1=80). However, when the same QDs with AB109373-COOH ligands are mixed with other siloxane molecules with various side chains. As we have learned in the previous examples, the QDs with AB109373-COOH ligand will not give transparent mixtures with siloxane molecules with a viscosity much higher than 100 cSt. However, the table below shows that even for siloxanes with relatively low viscosity, these QDs with AB109373-COOH ligand give turbid mixtures. This indicates that the siloxane backbone of the ligand preferably matches chemically with the backbone of the siloxane polymer it is to be mixed with. In this case, our AB109373-COOH ligand has 100% dimethyl groups, so that it disperses well in the 100% PDMS siloxanes. It is foreseen that in case the QDs need to be mixed with e.g. a phenylmethyl (50%) silicone, the ligands on the QDs should have a similar e.g. phenylmethyl (50%) siloxane backbone.

| | Side-chain | Visc. (cSt.) | +custom ligand (no QDs) | +custom ligand + QDs (LE) |
|---|---|---|---|---|
| AB109355 | dimethyl, vinyl term. | 4-8 | Clear | Clear |
| AB109356 | dimethyl | 100 | Clear | Clear |
| AB109358 | dimethyl | 1000 | Hazy | Hazy |
| AB123773 | Octyl, 100% | 600-1000 | Turbid | Turbid |
| AB252388 | Ethylmethyl (80%), 2-phenylpropylmethyl (20%) | 1200 | Turbid | Turbid |
| AB252389 | Hexylmethyl (50%) 2-phenylpropylmethyl (50%) | 1500-2000 | Phase Sep | Turbid |
| AB252390 | Dodecylmethyl (65%) 2-phenylpropylmethyl (35%) | 1200 | Clear/Phase Sep | Phase Sep |
| AB252387 | 2-phenylpropylmethyl (100%) | 1000 | Turbid | Turbid |
| AB128982 | Phenylmethyl (100%) | 100 | Turbid | Turbid |
| AB109385 | Phenylmethyl (50%) | 125 | Turbid | Turbid |
| AB181560 | Phenylmethyl (60%)* | 500 | Turbid | Turbid |

Example of a Curable Composition Using Low Molecular Weight Silicones

To prepare cured layers to following composition was used:

| Product Code | Name, type | Amount |
|---|---|---|
| AB109389 (Mw 2000-3000) | 25/35% methylhydrosiloxane | 0.2 ml |
| AB109356 (about 5000 Mw) | Pdms, vinyldimethoxysiloxy terminated | 0.8 ml |
| AB146697 | Platinum divinylmethyldisiloxane in xylene | 20 µl of a 1:300 dilution in xylene |

Layers were prepared using more concentrated QDs (CdSe) silicone liquids using dots redispersed in 100 µl toluene, the dots (CdSe) having AB109373-COOH grafting ligands. The liquid was dropcasted on eagle glass slides 3*3 cm, precleaned with iso-propanol and acetone. The layers were cured for one hour at 150° C. resulting in a transparent colored film. A bulk gel was prepared by curing for 2 hours at 70° C. Transparent layers and bulk materials of 5 mm thickness were obtained, as shown in FIG. 5, where the transparency of the material is demonstrated by placing it on top of a piece of text where the word "meet" is clearly visible. In another experiment a bulk gel was prepared using identical CdSe QDs that were not modified, i.e. not having AB109373-COOH grafting ligands, and using an identical silicone liquid composition as indicated in the table directly above, wherein the resulting bulk gel looked very turbid and having relatively big aggregates of quantum dots.

The invention claimed is:

1. A process for the production of a light converter comprising a siloxane polymer matrix with light converter nano particles embedded therein, the process comprising:
   mixing light converter nano particles having an outer surface grafted with grafting ligands and the curable siloxane polymers, and
   curing the curable siloxane polymers, thereby producing the light converter;
   wherein the grafting ligands comprise siloxane grafting ligands having x1 Si backbone elements, wherein at least one Si backbone element of each siloxane grafting ligand comprises a side group having a grafting functionality;
   wherein the curable siloxane polymers have y1 Si backbone elements;
   wherein x1 is at least 20, wherein y1 is at least 2, and wherein x1/y1>1.

2. The process according to claim 1, wherein x1 is at least 40, wherein y1 is at least 7.

3. The process according to claim 1, wherein the grafting ligands and the curable siloxane polymers are chemically substantially identical.

4. The process according to claim 1, wherein at least 80% of the side groups having grafting functionality of the siloxane grafting ligands and the curable siloxane polymers overlap in chemical identity.

5. The process according to claim 1, at least 90% the Si backbone elements of the siloxane grafting ligands have methyl side groups and wherein at least 90% the Si backbone elements of the curable siloxane polymers have methyl side groups.

6. The process according to claim 1, wherein both the grafting ligands and the curable siloxane polymers are poly methyl siloxanes, or poly phenyl siloxanes, or poly methylphenyl siloxanes, and wherein x1/y1≥1.2.

7. The process according to claim 1, wherein x1 is at least 50, wherein not more than 10 Si backbone elements of each siloxane grafting ligand comprise at least one side group having a grafting functionality selected from the group consisting of an amine comprising side group, a carboxylic acid comprising side group, a phosphine comprising side group, a phosphine oxide comprising side group, a phosphate comprising side group, and a thiol comprising side group.

8. The process according to claim 1 wherein at least one side group having a grafting functionality is selected from the group consisting of an amine comprising side group, a carboxylic acid comprising side group, a phosphine comprising side group, a phosphine oxide comprising side group, a phosphate comprising side group, and a thiol comprising side group.

9. The process according to claim 1, wherein the light converter nanoparticles are selected from the group consisting of core-shell nano particles, with cores and shells comprising one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

10. A light converter comprising a siloxane polymer matrix with light converter nano particles embedded therein, wherein:
the light converter nano particles have an outer surface grafted with grafting ligands, and
the siloxane polymer matrix comprises cross-linked siloxane polymers;
wherein the grafting ligands comprise siloxane grafting ligands having $x1$ Si backbone elements, wherein at least one Si backbone element of each siloxane grafting ligand comprises a side group having a grafting functionality selected from the group consisting of an amine comprising side group or an carboxylic acid comprising side group;
wherein the cross-linked siloxane polymers have $y1$ Si backbone elements;
wherein $x1$ is at least 20, wherein $y1$ is at least 2, and wherein $x1/y1>1$.

11. The light converter according to claim 10, wherein $x1$ is at least 40, wherein $y1$ is at least 7, and wherein at least 90% the Si backbone elements of the siloxane grafting ligands have methyl side groups, wherein at least 90% the Si backbone elements of the siloxane polymers have methyl side groups, and wherein the light converter nanoparticles are selected from the group consisting of core-shell nano particles, with cores and shells comprising one or more of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

12. The light converter according to claim 10, wherein the light converter is obtainable by the process according to any one of claim 1, and wherein $x1/y1 \geq 1.2$.

13. A lighting device comprising:
a light source configured to generate light source light; and
a light converter as defined in claim 10, configured to convert at least part of the light source light into visible converter light.

14. The lighting device according to claim 13, wherein the light converter is arranged at a non-zero distance from the light source.

15. A liquid crystal display device comprising a back lighting unit, wherein the back lighting unit comprises one or more lighting devices according to claim 14.

16. The lighting device according to claim 13, wherein the light converter is arranged in physical contact with the light source.

17. A liquid crystal display device comprising a back lighting unit, wherein the back lighting unit comprises one or more lighting devices according to claim 16.

18. A liquid crystal display device comprising a back lighting unit, wherein the back lighting unit comprises one or more lighting devices according to claim 13.

\* \* \* \* \*